United States Patent
Senior et al.

(10) Patent No.: US 9,618,422 B2
(45) Date of Patent: Apr. 11, 2017

(54) SPARK PLUG FOULING DETECTION

(71) Applicant: Ford Global Technologies, LLC, Dearborn, MI (US)

(72) Inventors: Russell Senior, Linden, MI (US); Nelson William Morrow, Saline, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 318 days.

(21) Appl. No.: 14/546,893

(22) Filed: Nov. 18, 2014

(65) Prior Publication Data
US 2016/0138553 A1 May 19, 2016

(51) Int. Cl.
| | |
|---|---|
| *G01M 15/04* | (2006.01) |
| *H01T 13/60* | (2011.01) |
| *G01R 19/15* | (2006.01) |
| *H01T 13/58* | (2011.01) |
| *F02P 17/12* | (2006.01) |
| *G01M 15/11* | (2006.01) |
| *F02P 3/04* | (2006.01) |

(52) U.S. Cl.
CPC ............ *G01M 15/042* (2013.01); *F02P 3/04* (2013.01); *F02P 17/12* (2013.01); *G01M 15/11* (2013.01); *G01R 19/15* (2013.01); *H01T 13/60* (2013.01)

(58) Field of Classification Search
CPC .......... F02P 17/12; F02P 3/04; G01M 15/042; G01M 15/11; G01R 19/15; H01T 13/60
USPC ................ 123/609, 636–638; 701/101–102; 73/114.62, 118.02
See application file for complete search history.

(56) References Cited

U.S. PATENT DOCUMENTS

| | | | |
|---|---|---|---|
| 5,446,385 A * | 8/1995 | Kugler | F02P 17/12 123/644 |
| 6,213,108 B1 | 4/2001 | Boyer et al. | |
| 6,236,213 B1 * | 5/2001 | Maruta | F02P 17/12 324/393 |
| 6,512,375 B1 | 1/2003 | Yamada et al. | |
| 6,920,783 B2 | 7/2005 | Kesler | |
| 7,404,396 B2 | 7/2008 | Toriyama et al. | |
| 7,451,640 B2 | 11/2008 | Asano et al. | |
| 8,078,384 B2 * | 12/2011 | Glugla | F02P 15/08 123/637 |
| 2005/0022776 A1 * | 2/2005 | Montgomery | F02D 41/008 123/295 |
| 2008/0007266 A1 | 1/2008 | Enomoto et al. | |

(Continued)

FOREIGN PATENT DOCUMENTS

CN 102235291 A 11/2011

*Primary Examiner* — Daniel S Larkin
*Assistant Examiner* — Anthony W Megna Fuentes
(74) *Attorney, Agent, or Firm* — Julia Voutyras; McCoy Russell LLP

(57) ABSTRACT

Methods and systems are provided for detecting spark plug fouling in an ignition system of an engine. In one example, a method may include directing current flow into a primary winding of an ignition coil of the ignition system for a duration of dwell period responsive to a dwell command from a controller, reducing the current flow to discharge an initial spark, and discharging additional sparks. The method may further include selectively generating an indication of a recommendation to change one or more spark plugs of the ignition system based upon a primary current measured after the dwell period.

20 Claims, 4 Drawing Sheets

(56) References Cited

U.S. PATENT DOCUMENTS

| | | | |
|---|---|---|---|
| 2010/0242583 A1* | 9/2010 | Chesney | F02P 11/06 73/114.62 |
| 2015/0112573 A1* | 4/2015 | Huberts | F02P 17/12 701/102 |
| 2015/0340846 A1* | 11/2015 | Schultz | F02P 3/0807 123/146.5 R |

\* cited by examiner

SPARK PLUG FOULING DETECTION

FIELD

The present description relates generally to methods and systems for controlling a vehicle engine to use a restrike on an ignition system of the vehicle to detect spark plug fouling.

BACKGROUND/SUMMARY

Spark plug fouling and pre-ignition caused by hot spark plugs is a significant issue in areas with poor fuel quality control. Fuel additives such as MMT or ferrocene may build up electrically conductive and thermally insulating deposits on the spark plug ceramic. Such build up may cause misfires or pre-ignition (PI). Due to the potential severity of misfires or PI at high speed and load in boosted engines, vehicle manufacturers may recommend very short spark plug change intervals. However, as the issue of misfires and PI due to fuel additive build up is often a geographically and seasonally limited issue, such frequent spark plug changes may be unnecessary for some vehicles. One approach to detecting spark plug fouling includes performing ion detection to measure ionization current generated from combustion through spark plug electrodes. However, ion detection involves the addition of specialized hardware elements within a typical ignition system, thereby increasing the cost and complexity of the system.

The inventors have recognized the above issues, and offer a system to at least partly address said issues. In particular, the present disclosure provides low cost and easy-to-implement methods and systems for continuously detecting the fouling level present at the spark plug, such that the customer may only be warned to change plugs when conditions warrant. Under some conditions, the methods and systems of the present disclosure may also help to reduce spark plug fouling, thereby offering further extensions of the time between spark plug changes. In one example, a method to address the above-described issues includes performing a high-frequency restrike and determining a spark plug condition based on a determination of coil primary current during the restrike. In this way, spark plug fouling may be detected by evaluating the primary current in the ignition system without using additional specialized hardware.

The present disclosure may offer several advantages. For example, by providing spark plug change recommendations based on evidence of malfunction or degradation, rather than a predetermined period of time or amount of vehicle usage, such recommendations may ensure that spark plug change recommendations are provided in a timely manner. The recommendations supported by measured indications of spark plug fouling may ensure that spark plug change recommendations are not provided too soon, resulting in increased cost for the driver, or too late, resulting in damage to the vehicle. Further, by determining spark plug fouling based on primary current in the ignition system, the overall cost of the ignition system may be reduced relative to systems that utilize other spark plug fouling determination mechanisms, such as ion detection, by controlling existing hardware elements.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

The following description relates to systems and methods for detecting spark plug fouling in an ignition system of an engine. The spark plug fouling detection enables spark plug change recommendations to be provided based on evidence of malfunction or degradation, rather than a predetermined period of time or amount of vehicle usage (e.g., recorded operational mileage, number of combustion cycles, etc.). By measuring primary current during high frequency restrike, an evaluation of energy dissipation during the restrike events may indicate conditions at a secondary side of the ignition coil. In this way, spark plug fouling may be determined without directly measuring activity at the secondary side of the ignition coil.

Figure 1:
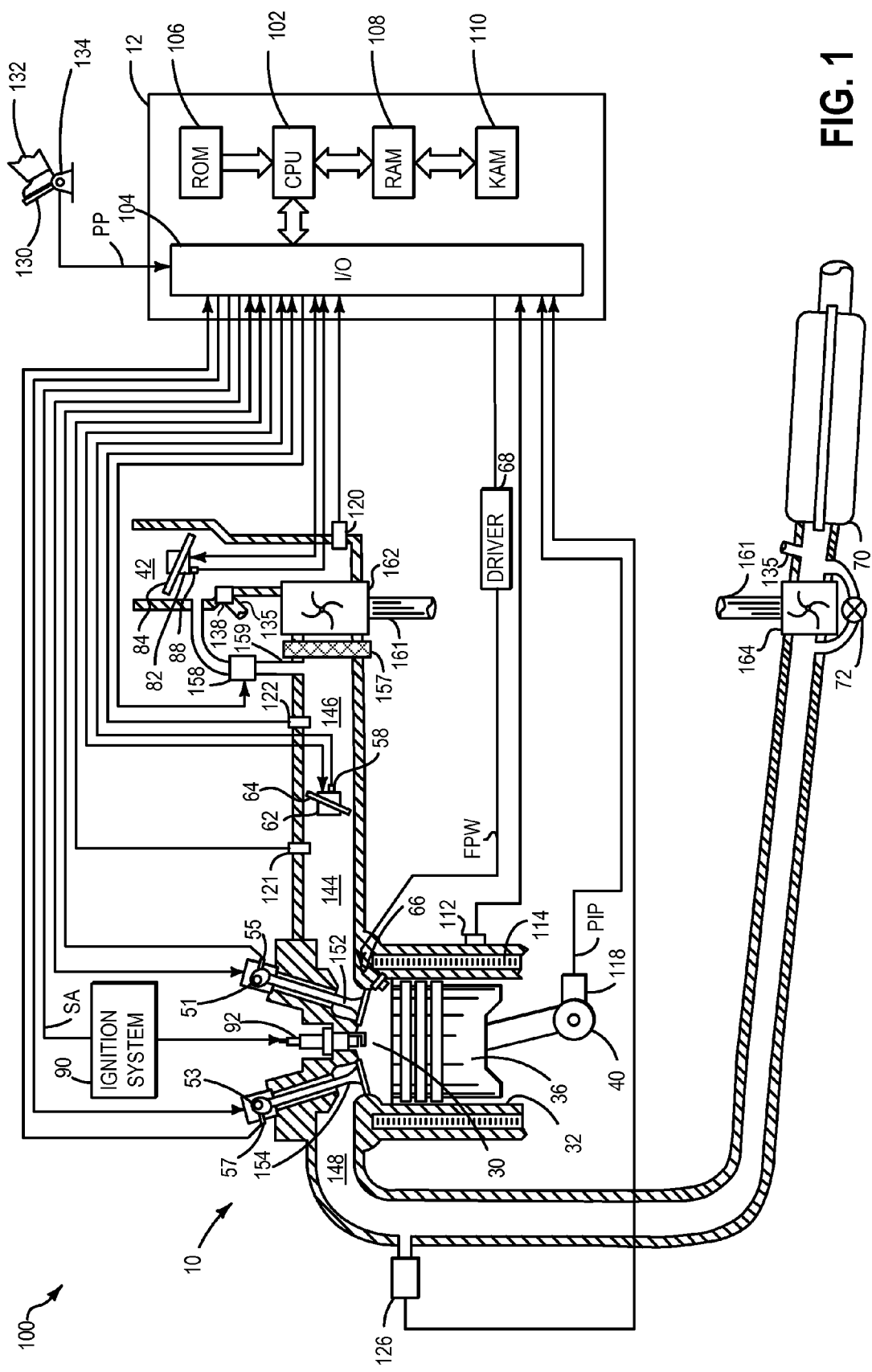
FIG. 1 is a schematic diagram of an engine.

FIG. 1 depicts an engine system 100 for a vehicle. The vehicle may be an on-road vehicle having drive wheels which contact a road surface. Engine system 100 includes engine 10 which comprises a plurality of cylinders. FIG. 1 describes one such cylinder or combustion chamber in detail. The various components of engine 10 may be controlled by electronic engine controller 12. Engine 10 includes combustion chamber 30 and cylinder walls 32 with piston 36 positioned therein and connected to crankshaft 40. Combustion chamber 30 is shown communicating with intake manifold 144 and exhaust manifold 148 via respective intake valve 152 and exhaust valve 154. Each intake and exhaust valve may be operated by an intake cam 51 and an exhaust cam 53. Alternatively, one or more of the intake and exhaust valves may be operated by an electromechanically controlled valve coil and armature assembly. The position of intake cam 51 may be determined by intake cam sensor 55. The position of exhaust cam 53 may be determined by exhaust cam sensor 57.

Fuel injector 66 is shown positioned to inject fuel directly into cylinder 30, which is known to those skilled in the art as direct injection. Alternatively, fuel may be injected to an intake port, which is known to those skilled in the art as port injection. Fuel injector 66 delivers liquid fuel in proportion to the pulse width of signal FPW from controller 12. Fuel is delivered to fuel injector 66 by a fuel system (not shown) including a fuel tank, fuel pump, and fuel rail. Fuel injector 66 is supplied operating current from driver 68 which responds to controller 12. In addition, intake manifold 144 is shown communicating with optional electronic throttle 62 which adjusts a position of throttle plate 64 to control airflow to engine cylinder 30. This may include controlling airflow of boosted air from intake boost chamber 146. In some embodiments, throttle 62 may be omitted and airflow to the engine may be controlled via a single air intake system throttle (AIS throttle) 82 coupled to air intake passage 42 and located upstream of the boost chamber 146.

In some embodiments, engine 10 is configured to provide exhaust gas recirculation, or EGR. When included, EGR is provided via EGR passage 135 and EGR valve 138 to the engine air intake system at a position downstream of air intake system (AIS) throttle 82 from a location in the exhaust system downstream of turbine 164. EGR may be drawn from the exhaust system to the intake air system when there is a pressure differential to drive the flow. A pressure differential can be created by partially closing AIS throttle 82. Throttle plate 84 controls pressure at the inlet to compressor 162. The AIS may be electrically controlled and its position may be adjusted based on optional position sensor 88.

Compressor 162 draws air from air intake passage 42 to supply boost chamber 146. In some examples, air intake passage 42 may include an air box (not shown) with a filter. Exhaust gases spin turbine 164 which is coupled to compressor 162 via shaft 161. A vacuum operated wastegate actuator 72 allows exhaust gases to bypass turbine 164 so that boost pressure can be controlled under varying operating conditions. In alternate embodiments, the wastegate actuator may be pressure or electrically actuated. Wastegate 72 may be closed (or an opening of the wastegate may be decreased) in response to increased boost demand, such as during an operator pedal tip-in. By closing the wastegate, exhaust pressures upstream of the turbine can be increased, raising turbine speed and peak power output. This allows boost pressure to be raised. Additionally, the wastegate can be moved toward the closed position to maintain desired boost pressure when the compressor recirculation valve is partially open. In another example, wastegate 72 may be opened (or an opening of the wastegate may be increased) in response to decreased boost demand, such as during an operator pedal tip-out. By opening the wastegate, exhaust pressures can be reduced, reducing turbine speed and turbine power. This allows boost pressure to be lowered.

Compressor recirculation valve 158 (CRV) may be provided in a compressor recirculation path 159 around compressor 162 so that air may move from the compressor outlet to the compressor inlet so as to reduce a pressure that may develop across compressor 162. A charge air cooler 157 may be positioned in passage 146, downstream of compressor 162, for cooling the boosted aircharge delivered to the engine intake. In the depicted example, compressor recirculation path 159 is configured to recirculate cooled compressed air from downstream of charge air cooler 157 to the compressor inlet. In alternate examples, compressor recirculation path 159 may be configured to recirculate compressed air from downstream of the compressor and upstream of charge air cooler 157 to the compressor inlet. CRV 158 may be opened and closed via an electric signal from controller 12. CRV 158 may be configured as a three-state valve having a default semi-open position from which it can be moved to a fully-open position or a fully-closed position.

Distributorless ignition system 90 provides an ignition spark to combustion chamber 30 via spark plug 92 in response to controller 12. The ignition system 90 may include an induction coil ignition system, in which an ignition coil transformer is connected to each spark plug of the engine. An example ignition system that may be utilized in the engine of FIG. 1 is described in more detail below with respect to FIG. 2. Universal Exhaust Gas Oxygen (UEGO) sensor 126 is shown coupled to exhaust manifold 148 upstream of catalytic converter 70. Alternatively, a two-state exhaust gas oxygen sensor may be substituted for UEGO sensor 126. Converter 70 can include multiple catalyst bricks, in one example. In another example, multiple emission control devices, each with multiple bricks, can be used. Converter 70 can be a three-way type catalyst in one example. While the depicted example shows UEGO sensor 126 upstream of turbine 164, it will be appreciated that in alternate embodiments, UEGO sensor may be positioned in the exhaust manifold downstream of turbine 164 and upstream of convertor 70.

Controller 12 is shown in FIG. 1 as a microcomputer including: microprocessor unit 102, input/output ports 104, read-only memory 106, random access memory 108, keep alive memory 110, and a conventional data bus. Controller 12 is shown receiving various signals from sensors coupled to engine 10, in addition to those signals previously discussed, including: engine coolant temperature (ECT) from temperature sensor 112 coupled to cooling sleeve 114; a position sensor 134 coupled to an accelerator pedal 130 for sensing accelerator pedal position (PP) adjusted by a foot 132 of a vehicle operator; a knock sensor for determining ignition of end gases (not shown); a measurement of engine manifold pressure (MAP) from pressure sensor 121 coupled to intake manifold 144; a measurement of boost pressure from pressure sensor 122 coupled to boost chamber 146; an engine position sensor from a Hall effect sensor 118 sensing crankshaft 40 position; a measurement of air mass entering the engine from sensor 120 (e.g., a hot wire air flow meter); and a measurement of throttle position from sensor 58. Barometric pressure may also be sensed (sensor not shown) for processing by controller 12. In a preferred aspect of the present description, engine position sensor 118 produces a predetermined number of equally spaced pulses every revolution of the crankshaft from which engine speed (RPM) can be determined.

In some embodiments, the engine may be coupled to an electric motor/battery system in a hybrid vehicle. The hybrid vehicle may have a parallel configuration, series configuration, or variation or combinations thereof.

During operation, each cylinder within engine 10 typically undergoes a four stroke cycle: the cycle includes the intake stroke, compression stroke, expansion stroke, and exhaust stroke. During the intake stroke, generally, the exhaust valve 154 closes and intake valve 152 opens. Air is introduced into combustion chamber 30 via intake manifold 144, and piston 36 moves to the bottom of the cylinder so as to increase the volume within combustion chamber 30. The position at which piston 36 is near the bottom of the cylinder and at the end of its stroke (e.g. when combustion chamber 30 is at its largest volume) is typically referred to by those of skill in the art as bottom dead center (BDC). During the compression stroke, intake valve 152 and exhaust valve 154 are closed. Piston 36 moves toward the cylinder head so as to compress the air within combustion chamber 30. The point at which piston 36 is at the end of its stroke and closest to the cylinder head (e.g. when combustion chamber 30 is at its smallest volume) is typically referred to by those of skill in the art as top dead center (TDC). In a process hereinafter referred to as injection, fuel is introduced into the combustion chamber. In a process hereinafter referred to as ignition, the injected fuel is ignited by known ignition means such as spark plug 92, resulting in combustion. During the expansion stroke, the expanding gases push piston 36 back to BDC. Crankshaft 40 converts piston movement into a rotational torque of the rotary shaft. Finally, during the exhaust stroke, the exhaust valve 154 opens to release the combusted air-fuel mixture to exhaust manifold 148 and the piston returns to TDC. Note that the above is described merely as an example, and that intake and exhaust valve opening and/or closing timings may vary, such as to provide positive or negative valve overlap, late intake valve closing, or various other examples.

Figure 2:
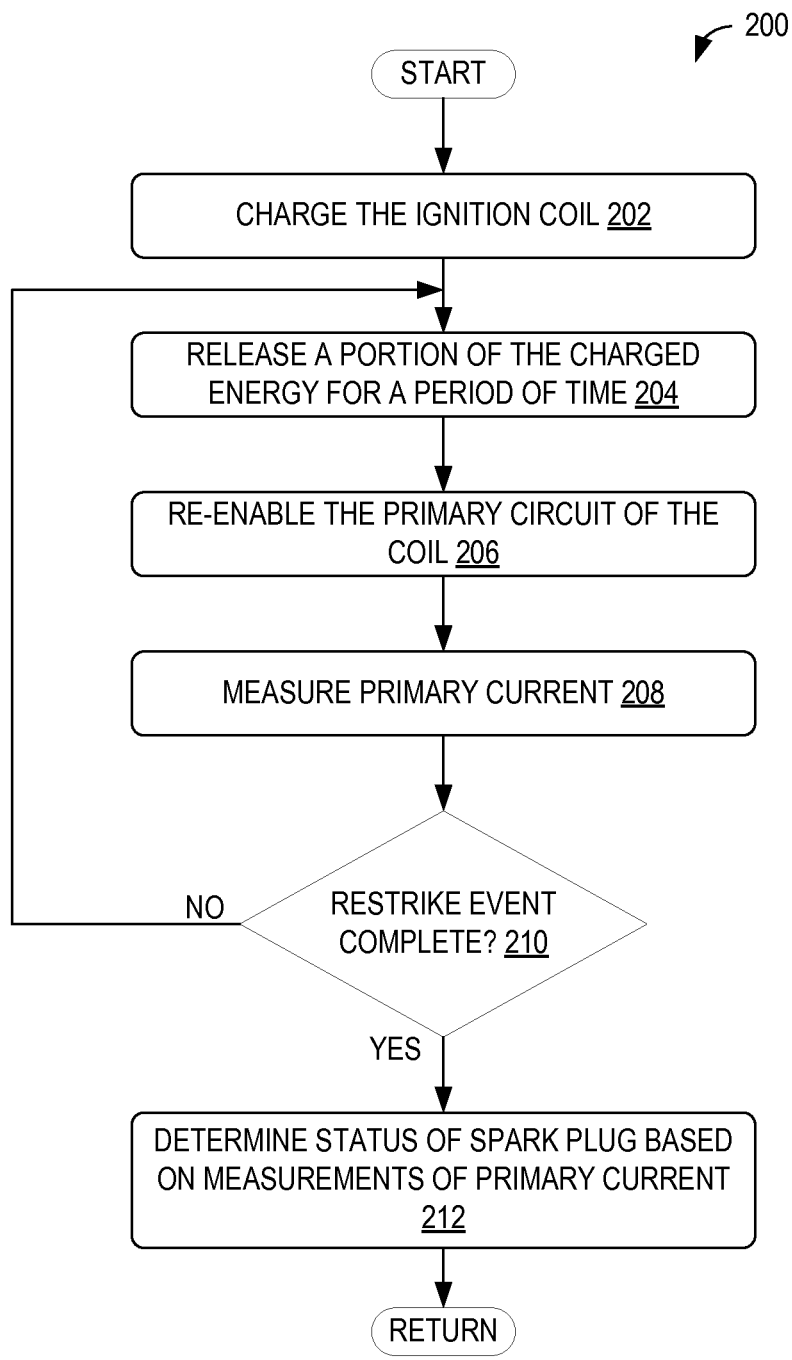
FIG. 2 is a flow diagram of a method of determining spark plug conditions in accordance with embodiments of the present disclosure.

FIG. 2 is a flow chart of an example method 200 for detecting spark plug fouling via high frequency multiple sparking. At 202, method 200 includes charging the ignition coil. For example, based on a control signal from an engine controller, (e.g., an ignition coil dwell command), current flows through the primary winding of the ignition coil creating an electromagnetic field for a duration of a dwell period. In this way, the length of time that current flows through the primary winding is equal to the total duration of the dwell period for that strike or restrike event. At 204, method 200 includes releasing a portion of the charged energy for a period of time. For example, responsive to a control signal from the engine controller instructing the ignition system to stop charging the primary winding, current flow to the primary winding may be stopped and the electromagnetic field may collapse, creating a current in the secondary winding. At 206, method 200 includes re-enabling the primary circuit of the coil. It is to be understood that restrike events may be used in various applications and/or under certain operating conditions. For example, restrike may be tuned or calibrated for particular operating conditions with the "on" or dwell/re-dwell time and the "off" time between subsequent coil charging events typically determined using look-up tables based on operating conditions/parameters such as engine speed, temperature, and load, for example. While actual times may vary by application and operating conditions, the "on" and "off" times may be on the order of microseconds, and may generally be fixed during a particular combustion cycle so that each restrike interval is the same. In additional or alternative examples, an initial spark event after the primary dwell may be longer than subsequent re-strike events. For example, the first primary current "off" time may be 600 µs and subsequent restrikes may each have "off" times of 50 µs.

At 208, method 200 includes measuring the primary current. At 210, the method includes determining whether the restrike event is complete. For example, the restrike event may be determined to be complete if all or a predetermined amount of the initially charged energy is dissipated. Additionally or alternatively, the restrike event may be determined to be complete if a predetermined and/or selected number of restrikes have occurred (e.g., if steps 204-206 have been repeated a threshold number of times). If the restrike event is not complete (e.g., "NO" at 210), the method returns to 204 to release another portion of the charged energy for a period of time. If the restrike event is complete (e.g., "YES" at 210), the method proceeds to 212 to determine a status of the spark plug based on the measurements of primary current gathered at 208. Although a measurement of the primary current is described to occur after re-enabling the primary circuit of the coil, it is to be understood that primary current may be measured both during the dwell period and during restrike.

Figure 3:
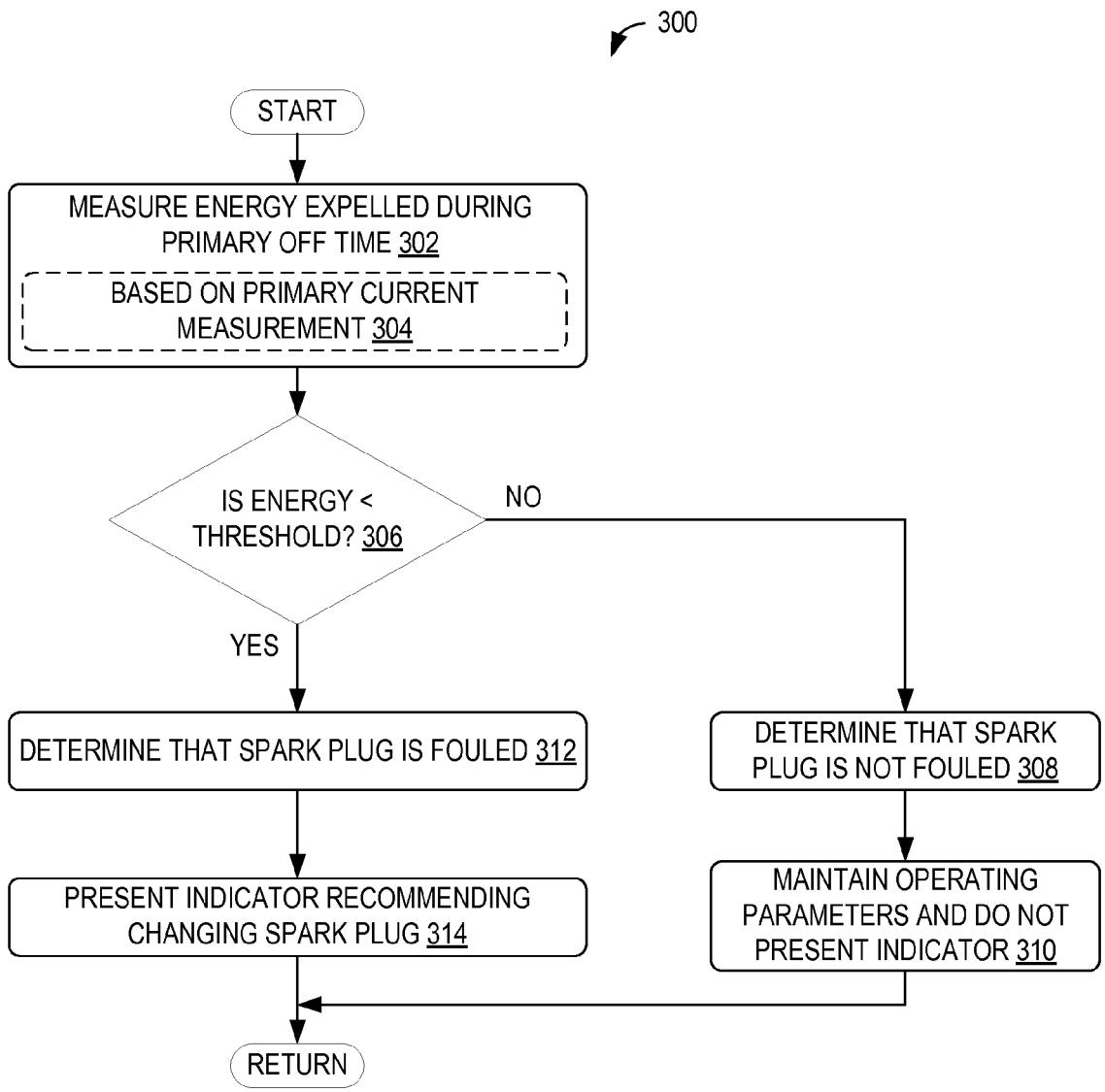
FIG. 3 is a flow diagram of a method of determining spark plug fouling in accordance with embodiments of the present disclosure.

FIG. 3 is a flow chart of an example method 300 for determining the status of a spark plug. For example, method 300 may be performed during execution of method 200 of FIG. 2 (e.g., in order to determine the status of the spark plug at 214 of method 200). At 302, method 300 includes measuring energy expelled during primary off time (e.g., while current is not flowing to the primary windings of the ignition coil). For example, as indicated at 304, the energy expelled during primary off time may be based on a primary current measurement. The magnitude of the primary current after the off time will give some indication of the conditions on the secondary side of the ignition coil by indicating an amount of current reduction between restrike events. At 306, method 300 includes determining whether the measured expelled energy is below a threshold (e.g., a predetermined value). If the measured expelled energy is not below the threshold (e.g., is greater than or equal to the threshold, "NO" at 306), the method proceeds to 308 to determine that the spark plug is not fouled and/or is operating normally. For example, if the measured current (e.g., after a peak current) is below a threshold (e.g., indicating that a total amount of current reduction representing the difference between a peak current and/or an earlier-performed restrike and a steady-state current and/or later-performed restrike is above a threshold), the energy may be determined to be below the threshold at 306. The method may further proceed to 310 to maintain current operating parameters and not present an indicator to change a spark plug. If the measured energy is below the threshold (e.g., "YES" at 306), the method proceeds to 312 to determine that the spark plug is fouled. For example, if the measured current (e.g., after a peak current) is above a threshold (e.g., indicating that a total amount of current reduction representing the difference between a peak current and/or an earlier-performed restrike and a steady-state current and/or later-performed restrike is below a threshold), the energy may be determined to be above the threshold at 306. As indicated at 314, the method may further include presenting an indicator (e.g., displaying the indicator on an instrument panel of the vehicle) recommending changing the spark plug. It is to be understood that one or more additional parameters may be evaluated to determine whether the spark plug is fouled. For example, the spark plug fouling may be confirmed by evaluating misfire monitor (e.g., to determine whether misfire has occurred) in combination with measuring the primary current.

Figure 4:
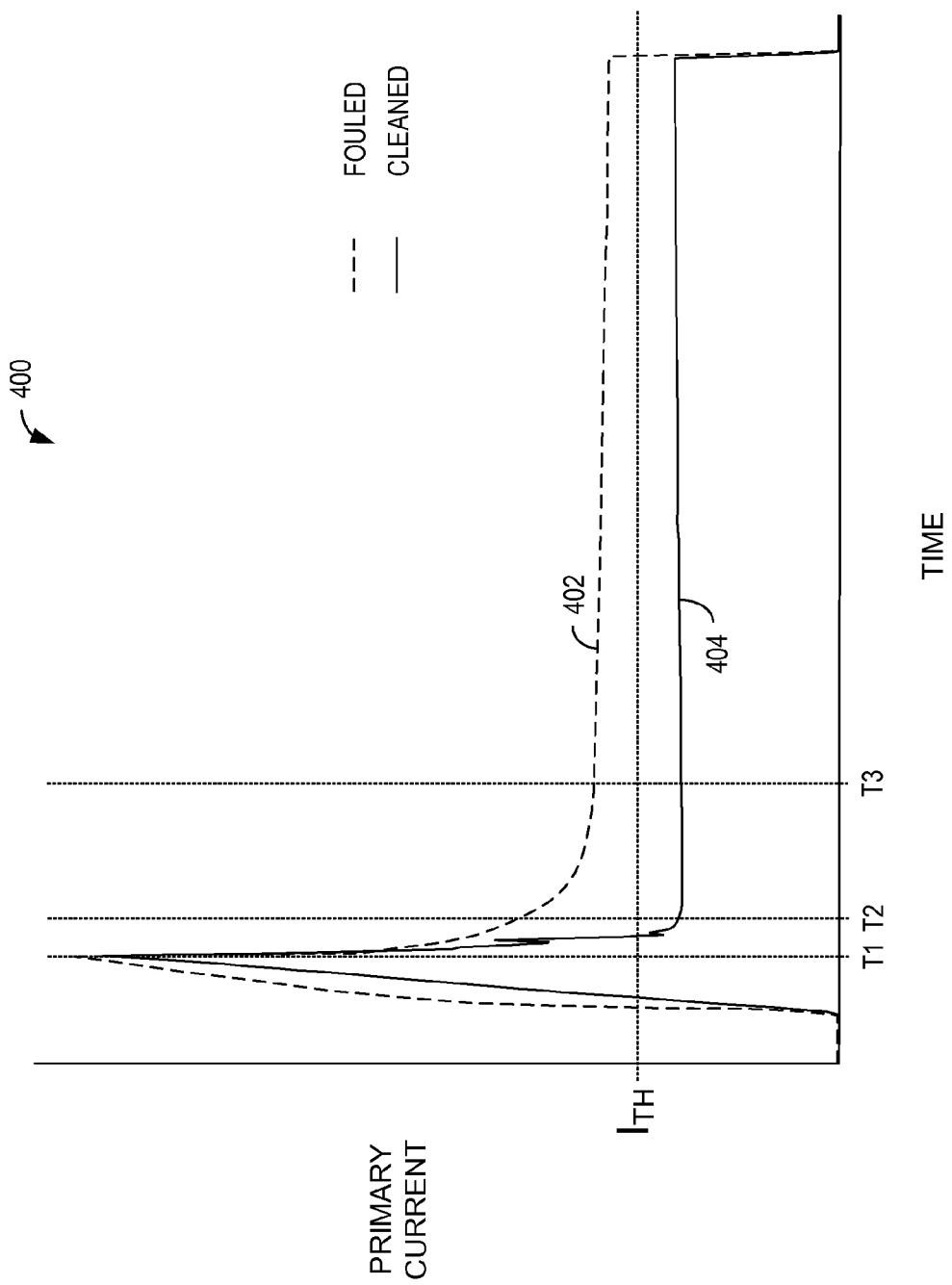
FIG. 4 shows waveforms of primary current upper envelopes for fouled and cleaned spark plugs in accordance with embodiments of the present disclosure.

FIG. 4 is a plot 400 of example a primary current average upper envelope of each of a fouled spark plug (402) and a cleaned spark plug (e.g., a spark plug having no fouling or fouling below a threshold amount, 404). As illustrated, each primary current average upper envelope curve 402 and 404 shows an average of a plurality of envelope curves calculated for each of a plurality of primary current events to show the peak primary current during high frequency restrike. For example, at approximately time T1, the peak primary current is measured for each of the fouled and cleaned spark plugs. The slope of each curve following the peak primary current indicates the amount of current reduction between successive restrike events (e.g., the difference in the amount of energy dispelled during each successive restrike). As shown at approximately time T2, the primary current of the cleaned spark plug is lower than the primary current of the fouled spark plug. In this way, the measurements show that the current reduction in the fouled spark plug occurs more slowly than that of the cleaned spark plug, due to the slower energy drain of the fouled spark plug. With smaller secondary breakdown voltage (e.g., as occurs when a spark plug is fouled), the spark event is mostly inductive, which reduces the coil energy at a slower rate. With higher breakdown voltage, the secondary current is also higher, as the capacitive discharge becomes a larger part of the spark event, allowing the coil energy to decrease at a faster rate. In this way, the primary current (which is related to the amount of energy dispelled) may be analyzed to estimate secondary current/voltage and thereby diagnose spark plug conditions.

As indicated at time T3, when current is approximately steady-state in both the fouled and cleaned spark plugs, the current measurement of the fouled spark plug is above the current threshold (e.g., the amount of energy dispelled is below an energy threshold), while the cleaned spark plug current is below the current threshold.

In this way, the primary current measurement may be compared to the current threshold to determine whether the spark plug is fouled to such a degree that the isolation resistance of the spark plug is lowered enough to affect operation of the spark plug (e.g., due to the presence of conductive deposits on the spark plug, such as carbon deposits with moisture content originating from pre-combustion fuel charge, water, etc.). As primary current may be measured for other purposes (e.g., for controlling the dwell time of the ignition coil), performing such a measurement may be more easily completed than performing a direct measurement of secondary windings of an ignition coil. Since the ignition coil is an inductive device, the amount of primary current is related to how much electrical charge there is in the coil. By turning the coil on and off for a pre-determined amount of time, the primary current measurement will change depending on how much energy is transferred through the secondary side (spark plug). The rate of reduction in primary current at each turn on event will be related to how much secondary current is flowing in order to provide an indication of conditions at the secondary winding of the ignition coil without performing a direct measurement. Furthermore, by determining spark plug fouling via primary current measurements as described in this disclosure, spark plug replacement indicators may be displayed responsive to the presence of a fouled spark plug, rather than the expiration of a time period, in order to reduce unnecessary/costly spark plug changes and provide a more rapid response to spark plug degradation. The technical effect of measuring primary current and comparing the measurement to a threshold is to detect fouled spark plugs and/or present an indicator of the fouled spark plugs.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller.

It will be appreciated that the configurations and routines disclosed herein are exemplary in nature, and that these specific embodiments are not to be considered in a limiting sense, because numerous variations are possible. For example, the above technology can be applied to V-6, I-4, I-6, V-12, opposed 4, and other engine types. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. An engine method, comprising: directing current flow into a primary winding of an ignition coil of an ignition system for a duration of dwell period responsive to a dwell command from a controller; reducing the current flow to discharge an initial spark from a spark plug; discharging additional sparks; and selectively generating an indication of a recommendation to change one or more spark plugs of the ignition system based upon a primary current measured at the primary winding after the dwell period.

2. The method of claim 1, wherein the primary current is measured via a current sensor, and wherein the indication of the recommendation to change the one or more spark plugs is provided when the measured primary current is above a predetermined value.

3. The method of claim 2, wherein generating the indication of the recommendation to change the one or more spark plugs comprises outputting an audible or visual indication of the recommendation.

4. The method of claim 1, wherein the indication of the recommendation to change the one or more spark plugs is not provided when the measured primary current is below a predetermined value.

5. The method of claim 1, wherein discharging additional sparks comprises re-enabling current to flow into the primary winding and then disabling current from flowing into the primary winding after the initial spark, the method further comprising determining an amount of energy expelled while disabling current from flowing into the primary winding.

6. The method of claim 5, wherein the recommendation to change the one or more spark plugs is provided when the amount of energy expelled is below a predetermined value.

7. The method of claim 5, wherein the recommendation to change the one or more spark plugs is not provided when the amount of energy expelled is above a predetermined value.

8. The method of claim 1, further comprising evaluating a misfire monitor and selectively generating the indication of the recommendation to change the one or more spark plugs of the ignition system based upon the primary current measured after the dwell period and an output of the misfire monitor.

9. A system comprising: an ignition coil including primary windings and secondary windings; a spark plug coupled to the secondary windings of the ignition coil; and a controller configured to execute non-transitory instructions to: direct current flow into a primary winding of an ignition coil of an ignition system for a duration of dwell period via a dwell command; reduce the current flow to discharge an initial spark from a spark plug; discharge additional sparks; and selectively generate an indication of a recommendation to change the spark plug based upon a primary current measured at the primary winding after the dwell period.

10. The system of claim 9, wherein selectively generating the indication of the recommendation to change the spark plug comprises outputting an audible or visual indication of the recommendation.

11. The system of claim 9, further comprising a current sensor, wherein the primary current is measured via the current sensor, and wherein the indication of the recommendation to change the spark plug is provided when the measured primary current is above a predetermined value.

12. The system of claim 9, wherein the indication of the recommendation to change the spark plug is not provided when the measured primary current is below a predetermined value.

13. The system of claim 9, wherein discharging additional sparks comprises re-enabling current to flow into the primary winding and then disabling current from flowing into the primary winding after the initial spark, the instructions further executable to determine an amount of energy expelled while disabling current from flowing into the primary winding.

14. The system of claim 13, wherein the recommendation to change the spark plug is provided when the amount of energy expelled is below a predetermined value.

15. The system of claim 13, wherein the recommendation to change the spark plug is not provided when the amount of energy expelled is above a predetermined value.

16. The system of claim 13, further comprising evaluating a misfire monitor and selectively generating the indication of the recommendation to change the one or more spark plugs of the ignition system based upon a primary current measured after the dwell period and an output of the misfire monitor.

17. An engine method, comprising:
discharging multiple sparks with an ignition system by selectively directing current flow into a primary winding of an ignition coil of the ignition system based on a dwell command from an engine controller;
measuring primary current of the primary winding of the ignition coil at multiple times during discharge of the multiple sparks; and
selectively generating an indication of a recommendation to change one or more spark plugs of the ignition system based upon the primary current measurements.

18. The engine method of claim 17, further comprising determining an amount of energy expelled while disabling current from flowing into the primary winding.

19. The method of claim 18, wherein the recommendation to change the one or more spark plugs is provided when the amount of energy expelled is below a predetermined value.

20. The method of claim 18, wherein the recommendation to change the one or more spark plugs is not provided when the amount of energy expelled is above a predetermined value.

* * * * *